United States Patent
Cai et al.

(10) Patent No.: US 11,708,503 B2
(45) Date of Patent: *Jul. 25, 2023

(54) THERMALLY INKJETTABLE ACRYLIC DIELECTRIC INK FORMULATION AND PROCESS

(71) Applicant: FUNAI ELECTRIC CO., LTD., Daito (JP)

(72) Inventors: Xiaorong Cai, Lexington, KY (US); Michael John Dixon, Lexington, KY (US); Yimin Guan, Lexington, KY (US); Ann P. Holloway, Lexington, KY (US); Jeanne Marie Saldanha Singh, Lexington, KY (US); Zhigang Xiao, Lexington, KY (US)

(73) Assignee: FUNAI ELECTRIC HOLDINGS CO., LTD., Osaka (JP)

( * ) Notice: Subject to any disclaimer, the term of this patent is extended or adjusted under 35 U.S.C. 154(b) by 452 days.

This patent is subject to a terminal disclaimer.

(21) Appl. No.: 16/886,126

(22) Filed: May 28, 2020

(65) Prior Publication Data

US 2020/0325349 A1   Oct. 15, 2020

Related U.S. Application Data

(60) Continuation of application No. 16/138,497, filed on Sep. 21, 2018, now Pat. No. 10,703,922, which is a
(Continued)

(51) Int. Cl.
*C09D 11/03* (2014.01)
*C09D 11/101* (2014.01)
(Continued)

(52) U.S. Cl.
CPC ........... *C09D 11/03* (2013.01); *B05D 3/0209* (2013.01); *B05D 3/0254* (2013.01);
(Continued)

(58) Field of Classification Search
None
See application file for complete search history.

(56) References Cited

U.S. PATENT DOCUMENTS 4,175,018 A * 11/1979 Gacesa ................. C25D 13/16
204/488
4,421,559 A   12/1983 Owatari
(Continued)

FOREIGN PATENT DOCUMENTS

EP   0089497 A2   2/1983
EP   0869160 A2   10/1998
(Continued)

OTHER PUBLICATIONS

JP-2006045494-A, Feb. 2006, Machine translation (Year: 2006).*

*Primary Examiner* — Satya B Sastri
(74) *Attorney, Agent, or Firm* — Amster, Rothstein & Ebenstein LLP

(57) ABSTRACT

An aqueous composition for forming a micro-fluid jet printable dielectric film layer, methods for forming dielectric film layers, and dielectric film layers formed by the method. The aqueous composition includes from about 5 to about 20 percent by 65 weight of a polymeric binder emulsion, from about 10 to about 30 percent by weight of a humectant, from about 0 to about 3 percent by weight of a surfactant, and an aqueous carrier fluid. The aqueous composition has a viscosity ranging from about 2 to about 6 centipoise at a temperature of about 23° C.

18 Claims, 1 Drawing Sheet

Related U.S. Application Data continuation of application No. 15/199,829, filed on Jun. 30, 2016, now Pat. No. 10,113,074, which is a continuation of application No. 14/152,577, filed on Jan. 10, 2014, now abandoned, which is a division of application No. 11/839,671, filed on Aug. 16, 2007, now Pat. No. 8,659,158.

(60) Provisional application No. 60/822,532, filed on Aug. 16, 2006.

(51) Int. Cl.
  *H05K 1/16* (2006.01)
  *C09D 11/30* (2014.01)
  *B05D 3/02* (2006.01)
  *C09D 11/107* (2014.01)
  *H05K 1/03* (2006.01)

(52) U.S. Cl.
  CPC .......... *C09D 11/101* (2013.01); *C09D 11/107* (2013.01); *C09D 11/30* (2013.01); *H05K 1/0373* (2013.01); *H05K 1/162* (2013.01); *H05K 2201/0209* (2013.01); *H05K 2203/013* (2013.01)

(56) References Cited

U.S. PATENT DOCUMENTS

| | | | |
|---|---|---|---|
| 4,655,864 A | 4/1987 | Rellick | |
| 5,132,248 A | 7/1992 | Drummond et al. | |
| 5,221,332 A | 6/1993 | Kohlmeier | |
| 5,762,695 A | 6/1998 | Wong et al. | |
| 6,121,171 A * | 9/2000 | Takahashi | H05K 1/0366 |
| | | | 442/289 |
| 6,184,268 B1 | 2/2001 | Nichols et al. | |
| 6,341,856 B1 | 1/2002 | Thompson et al. | |
| 6,646,024 B2 | 11/2003 | Beach et al. | |
| 6,842,657 B1 | 1/2005 | Drzaic | |
| 6,979,416 B2 | 12/2005 | Nakao et al. | |
| 7,402,617 B2 | 7/2008 | Ganapathiappan et al. | |
| 7,585,907 B2 | 9/2009 | Banba | |
| 7,690,301 B2 | 4/2010 | Aoai | |
| 8,659,158 B2 * | 2/2014 | Cai | C09D 11/03 |
| | | | 257/702 |
| 10,113,074 B2 * | 10/2018 | Cai | C09D 11/101 |
| 2003/0110978 A1 | 6/2003 | Abe et al. | |
| 2003/0148024 A1 | 8/2003 | Kodas et al. | |
| 2003/0185971 A1 | 10/2003 | Saksa et al. | |
| 2004/0003999 A1 * | 1/2004 | McCollum | C09D 5/18 |
| | | | 428/137 |
| 2004/0214480 A1 | 10/2004 | Kitajima | |
| 2004/0238804 A1 | 12/2004 | Revi | |
| 2005/0078158 A1 | 4/2005 | Magdassi et al. | |
| 2005/0090635 A1 | 4/2005 | Hommes et al. | |
| 2005/0137281 A1 | 6/2005 | Voss-Kehl et al. | |
| 2005/0176246 A1 | 8/2005 | Yang | |
| 2005/0189520 A1 | 9/2005 | Okada et al. | |
| 2005/0196974 A1 | 9/2005 | Weigel et al. | |
| 2005/0215689 A1 | 9/2005 | Garbar et al. | |
| 2005/0287377 A1 | 12/2005 | Wada | |
| 2006/0086976 A1 | 4/2006 | Mardilovich | |
| 2006/0125405 A1 | 6/2006 | Seo | |
| 2006/0279619 A1 | 12/2006 | Anderson et al. | |
| 2008/0014528 A1 | 1/2008 | Bailey et al. | |
| 2008/0081131 A1 * | 4/2008 | Muramatsu | C09D 4/00 |
| | | | 427/596 |

FOREIGN PATENT DOCUMENTS

| | | | |
|---|---|---|---|
| JP | 2005078948 A | | 3/2005 |
| JP | 2006045494 A | * | 2/2006 |
| WO | 0042622 A1 | | 7/2000 |
| WO | 2004005413 A1 | | 1/2004 |
| WO | 2005097920 A1 | | 10/2005 |

* cited by examiner

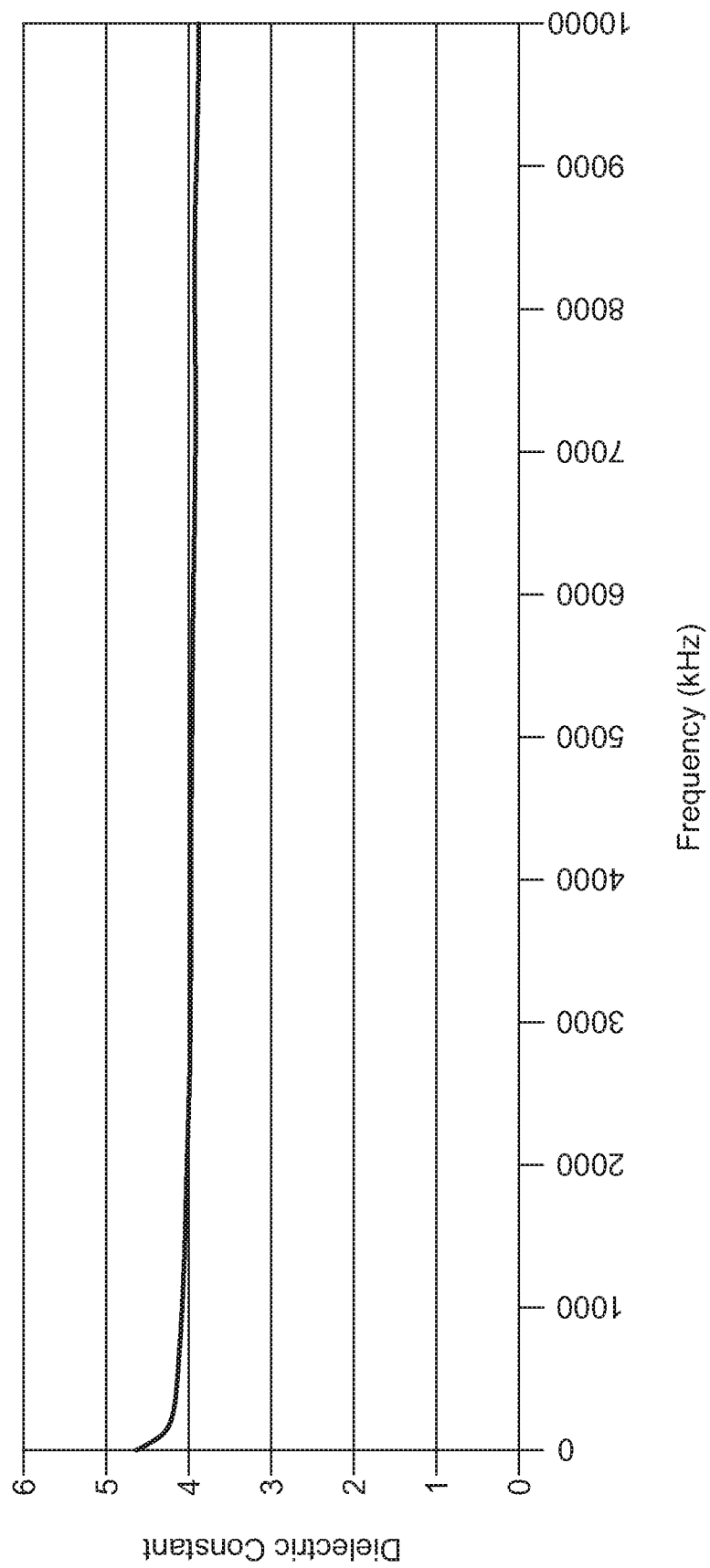

THERMALLY INKJETTABLE ACRYLIC DIELECTRIC INK FORMULATION AND PROCESS

This application is a Continuation of U.S. patent application Ser. No. 16/138,497 filed Sep. 21, 2018, which is a Continuation of U.S. patent application Ser. No. 15/199,829 filed Jun. 30, 2016, now U.S. Pat. No. 10,113,074, which is a Continuation of U.S. patent application Ser. No. 14/152,577 filed Jan. 10, 2014, which is a Divisional of U.S. patent application Ser. No. 11/839,671 filed Aug. 16, 2007, now U.S. Pat. No. 8,659,158, which claims the benefit of U.S. Provisional Application Ser. No. 60/822,532 filed Aug. 16, 2006, entitled "THERMALLY INKJETTABLE ACRYLIC DIELECTRIC INK FORMULATION AND PROCESS," incorporation by reference.

FIELD OF THE DISCLOSURE

Background and Summary

Micro-electronic circuits are typically made using expensive deposition, plating and etching technologies. Such technologies typically require significant investments, and clean room atmospheres. It is often time consuming and expensive to make slight variations in components, accordingly, manufacturing lines are often set up for a single application. Additionally, many electronic devices may require multi-level wiring or conductors as well as multi-level active and passive devices. In such multi-level constructions, dielectric layers may be used between the overlapping layers of active and passive devices. Accurate placement and formation of the dielectric layers using conventional techniques is often time consuming and requires specialized equipment. As circuits become more complicated, and require more levels of devices, there continues to be a need for improved and economical manufacturing techniques.

The foregoing and other needs may be provided by aqueous compositions for forming micro-fluid jet printable dielectric film layers, methods for forming dielectric film layers, and dielectric film layers formed by these methods. The aqueous compositions include from about 5 to about 20 percent by weight of a polymeric binder, from about 5 to about 30 percent by weight of a humectant, from about 0 to about 5 percent by weight of a surfactant, and an aqueous carrier fluid. The aqueous compositions have a viscosity ranging from about 2 to about 6 centipoise at a temperature of about 23° C.

In another aspect, the disclosure relates to a method of forming a dielectric layer. The method includes micro-fluid jet printing onto a substrate an aqueous film forming composition having from about 5 to about 20 percent by weight of a dispersion of a polymeric binder, from about 10 to about 30 percent by weight of a humectant, from about 0 to about 3 percent by weight of a surfactant, and an aqueous carrier fluid to provide a dielectric film layer. The composition has a viscosity ranging from about 2 to about 6 centipoise at a temperature of about 23° C. The dielectric film layer is provided by curing the micro-fluid jet printed film forming composition on the substrate.

The embodiments described herein provide improved compositions and techniques for forming dielectric layers that may be thermal jet printed onto a substrate. Advantage of the compositions and methods disclosed herein are that the compositions have enhanced film forming properties and dielectric layers formed with the compositions have improved electrical and mechanical properties.

BRIEF DESCRIPTION OF THE DRAWINGS

Further advantages of exemplary embodiments disclosed herein may become apparent by reference to the detailed description of exemplary embodiments when considered in conjunction with the drawing, as follows;

FIG. 1 is a graphical representation of dielectric constants versus frequencies for dielectric films made using compositions according to the disclosure.

DETAILED DESCRIPTION OF EXEMPLARY EMBODIMENTS

In order to provide a dielectric layer on a substrate using a micro-fluid jet printing device, fluids for providing the dielectric layer have certain criteria. Likewise, the resulting dielectric layers have requirements that are important to providing suitable dielectric layers on a substrate. Such requirements include, but are not limited to, electrical requirements, e.g., dielectric constant, resistivity, breakdown voltage, dissipation factor; fluid requirements, e.g., jetting reliability, stability, cartridge material compatibility, and the like; film integrity requirements; process/environmental requirements, e.g., compatibility with subsequent processing environment; and mechanical/physical/chemical requirements. For example, micro-fluid jettable fluids should be stable dispersions of particles or solids having a particle size ranging from about 50 to about 500 nanometers, a viscosity ranging from about 1 to about 10 centipoise at 25° C., and a surface tension ranging from about 20 to about 55 dynes per centimeter. Dielectric layers must be uniform and thick enough to provide electrical isolation between conductor layers. Preferably, dielectric layers will be no thicker than necessary to attain said isolation, but will be thick enough to avoid substantially all defects such as pinholes and cracks. Cured dielectric films should contain substantially no residual humectant. Another desirable characteristic of the resulting dielectric layers is that the layers are able to be cured at a temperature below the deformation and degradation temperatures of the substrate and any other functional layers such as conductors or fluid composition receiving layers. Film formation and curing may be conducted by air drying, or by application of heat and/or radiation. The most suitable film formation method will vary with the specifies of the formulation, but all heat and energy application must stay within the thermal budget of the substrate, functional layers, and the device or system to be fabricated. The faster the layer are cured and the lower the temperature, the more desirable. Resulting dielectric layers must not degrade during subsequent processing steps such as the overprinting and sintering of a conductor layer. The anticipated thermal budget will vary depending on the type and number of layers to be overprinted and cured, but a suitable target for use in a wide variety of systems is no substantial degradation at a temperature of about 180° C. after about 2 hours, as indicated by low weight loss measured with thermogravimetric analysis (TGA). Because water will affect the conductivity and dielectric properties of a dielectric film, if is desirable that water absorption be as low as possible. Water absorptions have been characterized after 24 hour immersion at room temperature conditions, and after 72 hour immersion at 40° C. and should be less than about 5 weight percent.

A fluid jet printable formulation that suitably provides a film forming dielectric layer that may meet the foregoing requirements includes a dispersion of polymeric binder emulsion, a humectant, and an aqueous carrier fluid. An optional component of the formulation is one or more surfactants. Other additives may be included in minor amounts to improve jetting performance and to achieve desirable final film properties.

Aqueous carrier fluids such as water are particularly preferred carrier fluids for the components of the fluid formulation. However, other carrier fluids, including, but not limited to glycols (e.g., mono-, di- or tri-ethylene glycols or higher ethylene glycols, propylene glycol, 1,4-butanediol or ethers of such glycols, thiodiglycol), glycerol and ethers and esters thereof, polyglycerol, mono-, di-, and tri-ethanolamine, propanolamine, N,N-dimethylformamide, dimethylsulfoxide, N,N-dimethylacetamide, N-methylpyrrolidone, 1,3-dimethylimidazolidone, methanol, ethanol, isopropanol, n-propanol, diacetone alcohol, acetone, methyl ethyl ketone, propylene carbonate, and combinations thereof may be used.

Of the foregoing components of the formulation, an important component is the dispersed polymeric binder emulsion. Suitable polymeric binder emulsions may be made with acrylic materials, epoxy materials, shellac materials, and isocyanate materials. Of the foregoing, the acrylic materials are particularly suitable for providing stable fluids that are micro-fluid jet printable. Acrylic materials, as described herein, may provide suitable adhesion to a wide variety of substrates; desirable electrical properties at room temperature and at moderately elevated temperatures; resistance to water, alcohol, alkalis, and acids; high resistance to mineral oil, vegetable oils, greases, and chemical fumes; relatively low water absorption, i.e., less than 0.2 percent in 24 hours; superior flexibility; and solderability.

The acrylic materials are typically provided as an emulsion such as an emulsion of a butyl acrylate/methyl methacrylate polymer having a particles size ranging from about 50 to about 500 nanometers. The fluid jet printable compositions made with the fluid may have a polymer particles content ranging from about 5 to about 20 percent by weight. For the purposes of this disclosure, particle size refers to the number average particle size and is measured using an instrument that uses transmission electron microscopy or scanning electron microscopy. Another method to measure particle size is dynamic light scattering, which measures weight average particle size. One example of such an instrument found to be suitable is available from MicroTrac, Inc. of Montgomeryville, Pa. under the trade designation of Microtrac UPA 150.

Acrylic materials are selected for their ability to form a film during the printing process. Accordingly, the acrylic materials may have a glass transition temperature that provides coalescence for film formation when heated to a temperature ranging from about 80° to about 100° C. over a period of time of less than about 5 minutes. For example, suitable film formation may be achieved with acrylic polymers having glass transition temperatures ranging from about 50° to about 110° C. Acrylic polymers with relatively lower glass transitions may tend to form films at undesirable locations such as on the cartridge nozzle plate or within the nozzle holes thereby preventing jetting. Additionally, films with similar chemistries and relatively higher glass transition temperatures will tend to have better dimensional stabilities in subsequent use and processing environments than those with lower glass transition temperatures.

Humectants are included in the formulation to prevent the fluids from drying or forming films on micro-fluid jetting device nozzle plates. However, if the resulting printed layer contains residual humectant, the glass transition temperature of the layer may be lower than desirable, the layer may have an undesirably high dielectric constant, the layer may be tacky, and/or there may be an oily or slick residue on the surface of the printed layer or at an interface between the printed layer and the substrate. Accordingly, the humectant is selected for an ability to remain in the fluid at room temperature over an extended period of time, but is readily removed from the fluid as the printed layer is cured.

Suitable humectants may be selected from dipropylene glycol (DPG), tripropylene glycol (TPG), triethylene glycol (TEG), tetraethylene glycol, 1-(2-hydroxyethyl)-2-pyrrolidone, trimethylpropane, 1,2-propanediol 1,3-propanediol, 1,5-pentanediol, 2-pyrrolidone, polyethylene glycol (PEG), diethylene glycol (DEG), 2,2-thiodiethanol, and mixtures thereof. Humectants with boiling points (BP) that are too high such as DPG (BP=232° C.) may not leave a film during the curing process resulting in very high water uptake values and weight loss in water immersion testing. Additionally such relatively high BP humectants may provide a slick residue that inhibits overprinting with further fluid receiving and conductive layers. Accordingly, a humectant having a BP ranging from about 100° to about 200° C., such as propylene glycol (B.P.=187° C.) may be a more desirable choice because it readily mixes with water and other ingredients in the fluid formulation and forms a "solution" with much lower co-boiling point. A film layer may be formed when an ink composition containing a polymer dispersion and a humectant having a BP in the above range is cured.

The amount of humectant used in the fluid formulation should be a minimum quantity needed to provide good start-up qualities and desirable fluid jettability. Accordingly, the humectant may be present in the formulation in an amount ranging from about 10 to about 30 percent by weight.

An optional component that may be used in the fluid formulation is one or more surfactants. Surfactants may be used to modify the surface tension and/or viscosity of the fluid to provide fluids having the surface tension and viscosity described above in order to adjust the jettability characteristics and the wetting characteristics of the fluid on the substrate. The minimal amount of surfactants necessary for reliable jetting should be used because these molecules may remain in the cured printed film thereby lowering its glass transition temperature, raising the dielectric constant, and potentially causing film tackiness/drying difficulties, and the like. Accordingly, the amount of total surfactant in the fluid compositions may range from about 0 to about 5 wt. %.

Surfactants that may be used to modify the surface tension and viscosity in an aqueous fluid formulation may include, but are not limited to, alkylaryl polyether alcohol nonionic surfactants, such as octylphenoxy-polyethoxyethanol available from Dow Chemical Company of Midland, Mich. under the TRITON X series of trade names; alkylamine ethoxylates nonionic surfactants such as from Dow Chemical Company under the TRITON FW series, TRITON CF-10, TERGITOL trade names; ethoxylated acetylenic diol surfactants available from Air Products and Chemicals, Inc. of Allentown, Pa. under the SURFYNOL trade name; polysorbate products available from ICI Chemicals & Polymers Ltd. of Middlesborough, UK under the trade name TWEEN; polyalkylene and polyalkylene modified surfactants available from Crompton OSI Specialties of Greenwich, Conn., under the trade name SILWET, polydimethylsiloxane copolymers and surfactants available from Crompton OSI Specialties under the trade name COATOSIL; alcohol alkoxylates nonionic surfactants available from Uniqema of New Castle, Del., under the trade names RENEX, BRU, and UKANIL; sorbitan ester products available from Omya Peralta GmbH of Hamburg, Germany under the trade names SPAN and ARLACEL; alkoxylated esters/polyethylene glycol surfactants available from ICI Chemicals & Polymers Ltd. under the trade names TWEEN, ATLAS, MYRJ and CIRRASOL; alkyl phosphoric acid ester surfactant products such as amyl acid phosphate available from Chemron Corporation of Paso Robles, Calif., under the trade name CHEMPHOS TR-421; alkyl amine oxides available from Chemmron Corporation under the CHEMOXIDE series of surfactants; anionic sarcosinate surfactants available from Hampshire Chemical Corporation of Nashua, N.H. under the HAMPOSYL series of surfactants; glycerol esters or polyglycol ester nonionic surfactants available from Calgene Chemical Inc. of Skokie, Ill. under the HODAG series of surfactants, available from Henkel-Nopco A/S of Drammen, Norway under the trade name ALPHENATE, available from Hoechst AG of Frankfurt, Germany under the trade name SOLEGAL W, and available from Auschem SpA of Milan, Italy under the trade name EMULTEX; polyethylene glycol ether surfactants available from Takemoto Oil and Fact Co. Ltd, of Japan under the trade name NEWKALGEN; modified poly-dimethyl-silicone surfactants available from BYK Chemie of Wesel, Germany under the BYK 300 series of surfactants; and other commercially available surfactants known to those skilled in the art. Particularly desirable surfactants are non-ionic surfactants.

Other additives can be included in the fluid compositions in small percentages as needed to improve jetting performance, or final film properties. Examples of other additives which may be used include, but are not limited to, particulate suspensions used to tailor the dielectric constant of the film layer, such as $TiO_2$, barium titanate, or strontium titanate, or particulate suspensions to precipitate/settle and assist with uniformity of solids deposition in the dielectric film layer such as cerium oxide. When particulate suspensions such as cerium oxide are used, the amount of particulates used in the compositions described herein may range from about 0 to about 5 weight percent of the total weight of the composition.

Suitable particles with high dielectric constants that may be used to increase the dielectric constant of the fluid compositions include strontium titanate, lead zirconate or other fillers that have a high dielectric constant such as those disclosed in U.S. Pat. No. 6,159,611 (Lee) and U.S. Pat. No. 6,586,791 (Lee). Specific examples include $BaTiO_3$, $SrTiO_3$, $Mg_2TiO_4$, $Bi_2(TiO_3)_3$, $PbTiO_3$, $NiTiO_3$, $CaTiO_3$, $ZnTiO_3$, $Zn_2TiO_4$, $BaSnO_3$, $Bi(SnO_3)_3$, $CaSnO_3$, $PbSnO_3$, $PbMgNbO_3$, $MgSnO_3$, $SrSnO_3$, $ZnSnO_3$, $BaZrO_3$, $CaZrO_3$, $PbZrO_3$, $MgZnO_3$, $SrZrO_3$, and $ZnZrO_3$. Dense polycrystalline ceramics such as barium titanate and lead zirconate are particularly suitable particles. Other particularly suitable particles include metal oxides such as aluminum, zinc, titanium, and zirconium oxides.

Typically, when particles are included in a micro-fluid jet printable composition, the composition may include from about 0 tip to and including 15 percent by volume inorganic particles or more, based on the total volume of the carrier fluid and inorganic particles.

The inorganic particles may be nano-sized particles having a diameter ranging from about 0.5 nanometers to about 3 microns. In some embodiments, the inorganic particles have an average size of 1 to 500 nanometers, while in other embodiments the inorganic particles have an average size of 10 to 250 nanometers, while in yet other embodiments the particles have an average size of 20 to 80 nanometers, or from 10 to 30 nanometers.

The particles may be mixed, dispersed, suspended, slurried, or emulsified in the carrier fluid. Dispersing agents that may be used to mix, disperse, suspend, slurry or emulsify the particles in the aqueous carrier fluid may include, but is not limited to, common aqueous-based dye/pigment dispersants such as lignin sulfonates, fatty alcohol polyglycol ethers, and aromatic sulfonic acids, for example naphthalene sulfonic acids. Some useful dispersants are polymeric acids or bases which act as electrolytes in aqueous solution in the presence of the proper counterions. Such polyelectrolytes provide electrostatic as well as steric stabilization of dispersed particles in an emulsion. Examples of polyacids include polysaccharides such as polyalginic acid and sodium carboxymethyl cellulose; polyacrylates such as polyacrylic acid, styrene-acrylate copolymers; polysulfonates such as polyvinyl sulfonic acid, styrene-sulfonate copolymers; polyphosphates such as polymetaphosphoric acid; polydibasic acids (or hydrolyzed anhydrides), such as styrene-maleic acid, copolymers; polytribasic acids such as acrylic acid-maleic acid copolymers. Examples of polybases include polyamines such as polyvinylamine, polyethyleneimine, poly(4-vinylpyridine); polyquaternary ammonium salts such as poly(4-vinyl-N-dodecyl pyridinium). Amphoteric polyelectrolytes may be obtained by the copolymerization of suitable acidic and basic monomers, for instance, methacrylic acid and vinyl pyridine.

An example of a micro-fluid jet printable fluid composition as described herein is provided in the following table.

TABLE 1

| Component | Weight % Range | Example |
|---|---|---|
| Acrylic polymer binder | 5-20 | 15.0 |
| Propylene glycol humectant | 10-30 | 15.0 |
| Ethoxylated 2,4,7,9-tetramethyl-5-decyn-4,7-diol surfactant | 0-3 | 2.5 |
| Silicon-free alcohol alkoxylate nonionic surfactant | 0.3 | 0.8 |
| Other additives | 0-10 | 0 |
| D.I. Water | Balance | 66.7 |
| Total | 100 | 100 |

Fluid cartridges were filled with about 20 ml of the dielectric fluid composition of the example provided in the above table using a syringe and the cartridges were primed using a vacuum pump followed by wet wipe/dry. A dielectric layer composition was printed on a rigid substrate using printer firmware and driver that allowed printing with control of ink drop density.

Printer and software settings were selected to print each layer with 720K dots per square inch with a droplet mass estimated to be about 24 ng. Optimal dielectric layer coverage will vary depending on the particular printhead/printer platform and the associated average drop mass. If was important that each layer included sufficient fluid so that droplets coalesced to achieve complete coverage with each layer so as to facilitate uniform film formation with substantially no pinholes or electrical short pathways.

Layers were sequentially printed and then heated/cured until a total layer thickness of 20-25 µm was provided. Accordingly, each printed layer was exposed to a heat lamp to bring the layer temperature to about 80° to about 100° C.

in about 30 seconds to about 1 minute. Such temperature enabled the acrylic polymer particles in the ink to be above their glass transition temperature which allowed for coalescing and film formation as the humectants and water were evaporated from the layer. The heating step was conducted with a 150 watt halogen flood light at 100 mm for 60 seconds or a 250 watt IR heat lamp at 45 mm for 30 seconds. Printing and curing were repeated until the total dielectric thickness exceeded 20 um. For example, formulations as provided by the example in the above table took from about 4 to about 10 layers at 720K dots/sq.inch with an approximately 24 ng drop mass to provide the desired thickness. Lower binder loadings may take more layers to achieve the desired thickness. Also, thinner films are frequently prone to pinholes and shorts while such problems are minimized with films having thicknesses above about 20 μm. Once the desired dielectric layer was printed and cured, the layer was subjected to a final cure cycle in an oven as follows: ramped at 2.5° C./min from 85° C., to 12° C.; held for 30 minutes at 125° C.; ramped down at 5° C./min until the layer reached a temperature of less than 85° C., then the printed substrate was removed from the oven.

Changes to the fluid jet printing process may make it possible to further optimize the printing and curing process. For example, printing more material per layer (for example doubling the layer coverage to 1.44 million dots/square inch) may require fewer layers to achieve the desired thickness. However, printing increased droplets per square inch may affect water management providing potential solids migration problems during the evaporation process resulting in non-uniform thickness layers, i.e., a "coffee ring" effect. For the foregoing formulation, printhead, and substrate, printing 720K dots/square inch allowed for effective water/humectant removal between layers. Heating may be achieved using an in-line heater or energy source or a heat on-demand on-carrier heater or energy source incorporated in the printer adjacent to the micro-fluid ejection head instead of using the heat lamps referenced above, thereby simplifying the process for the user and eliminating the need to remove and replace the substrate in the printer between subsequent printing and curing of the layers.

It is important that each subsequent layer be heated to above its glass transition temperature with enough energy to allow the film to coalesce. Temperatures are also desirably high enough to remove the humectants during this cure cycle, if film formation and humectant removal are judged sufficient after the interlayer cure process, then a final cure may not be necessary.

Electrical test structures (e.g., capacitors) were fabricated by printing over printed silver electrodes on an epoxy FR4 circuit board containing an ink receiving layer or on glossy photographic paper using the process described above. Free standing films were fabricated by printing onto cellulose acetate substrates and then peeling the resulting films. The test structures and films were used to measure electrical properties, water uptake, and mechanical properties. The epoxy FR4 grade circuit board is a fire rated electrical-grade laminate made from woven glass impregnated with epoxy resin. In the designation "FR4," the F stand for "flame," the R stands for "retardancies," and the 4 means a #4 epoxy. In general, these substrates have glass transition temperatures in the range of from about 125° to about 165° C.

Dielectric constants over a range of frequencies for films made with the composition of the example in the above table and printed by the foregoing procedure are illustrated in FIG. 1. The characteristic curve in FIG. 1 is typical of the performance of a wide variety of acrylic polymer emulsions. The average dielectric constants at 1 MHz for the example of Table 1 printed on the glossy photographic paper was 3.44 and on FR4 was 4.12. Other properties for a dielectric layer made with a composition of Table 1 are contained in Table 2.

TABLE 2

| | Properties | Film from Composition of Table 1 |
|---|---|---|
| Electrical Properties | Average dielectric constant K at 1 MHz | 4.12[b]/3.44[a] |
| | Average Dissipation Factor D at 1 MHz | 0.05[b]/0.34[a] |
| | Breakdown voltage | >500 V/mil[a] |
| | Resistivity ohm-cm | >1.0E+14[a] |
| Mechanical Properties[c] | Tensile strength (psi) to yield | 3300 |
| | % Elongation to break | 5.6 |
| | Tensile Modulus (psi) | 133000 |
| Thermal Properties[c] | 2 hour/180° C. weight loss (bulk) | 18.7 wt. % |
| | Average glass transition temperature ° C. (TGA Scan) | 43.8 |
| Water Uptake[c] Properties | 72 hour at 40° C. wt. % water uptake | 6.9 wt. % |
| | 24 hour ambient wt. % water uptake | 2.9 wt. % |

Notes:
[a]Samples prepared on microporous inkjet photo paper
[b]Samples prepared on FR4 board
[c]All samples for measurement of tensile, thermal, and water uptake properties were free standing films.

Good quality films having the required dielectric constant, breakdown voltage, and resistivity, as well as water uptake, that are suitable for use in use in a variety of electronic applications may also be achieved with other acrylic polymer emulsions. In addition to the properties stated above, mechanical properties were also acceptable and adhesion to the underlying ink receiving layer and silver electrode were qualitatively very good.

Finally dielectric films printed in accordance with the disclosed embodiments were shown to function as sealing layers that prevent electromigration of silver between adjacent conductive traces. To demonstrate this property, conductive silver traces were printed adjacent to one another with a 400 μm gap between them. They were placed in a chamber at 85° C. at 85% relative humidity with a 20V bias between them. When printed on a fluid composition receiving layer on FR4 or on microporous photo paper dendritic growth was obvious and electrical shorts occurred in less than 24 hours.

When printed on the dielectric layer made with the composition described herein and then overprinted with the same dielectric layer such that the silver traces were encapsulated, no signs of electromigration were evident after 40 days of continuous electrical bias in the chamber at 85° C. and 85% relative humidity.

As a further example of the utility and functionality of the dielectric made with the composition described herein, a dielectric layer of the example formulation from table 1 above was fabricated using the above outlined printing and curing steps as part of a multilayer inkjet printed circuit on an FR4 substrate. The circuit consisted of a first fluid composition receiving layer, a first conductive layer, the dielectric layer, a second fluid composition receiving layer, and a second conductive layer. The circuit layout included an electrical via between the first and second conductive layers. The circuit also included surface mount components. When appropriately connected to a power source two surface mount LED's were made to flash in an alternating fashion to demonstrate circuit functionality. The dielectric layer achieved the isolation between conductive layers necessary for proper circuit function.

In summary, functional dielectric films may be fabricated using the above dielectric ink formulations and micro-fluid jet fabrication processes described herein. Such films may have good electrical and mechanical properties which enable their use in a multilayer (2 conductive layers on ink receiving layers with a via connection through a dielectric layer) micro-fluid jet printed circuit board.

Another advantage of using micro-fluid ejection heads to deposit the dielectric films on a substrate is that such printing techniques enable dielectric layers to be precisely deposited without potentially damaging or contaminating the substrate. Micro-fluid jet printing is a non-contact printing method, thus allowing insulating or dielectric materials to be printed directly onto substrates without damaging and/or contaminating the substrate surface due to contact, as may occur when using screens or tools and/or wet processing during conventional patterning, depositing, and etching. Micro-fluid jet printing also provides a highly controllable deposition method that may provide precise and consistently applied material to the substrate. Micro-fluid ejection heads for depositing the fluids described above may be selected from ejection heads having thermal actuators, piezoelectric actuators, electromagnetic actuators, and the like.

Devices and articles that may be made using the fluid compositions according to the disclosure include transistors, diodes, capacitors (e.g., embedded capacitors), and resistors. The foregoing components may be used in various arrays to form amplifiers, receivers, transmitters, inverters, oscillators, electroluminescent displays and the like.

It is contemplated, and will be apparent to those skilled in the art from the preceding description and the accompanying drawings that modifications and/or changes may be made in the embodiments of the disclosure. Accordingly, it is expressly intended that the foregoing description and the accompanying drawings are illustrative of exemplary embodiments only, not limiting thereto, and that the true spirit and scope of the present disclosure be determined by reference to the appended claims.

What is claimed is:

1. An electronic device that comprises a dielectric layer, the dielectric layer being formed by one or more layers of an aqueous composition comprising:
   from about 5 to about 20 percent by weight of a dispersion of a polymeric binder;
   from about 5 to about 30 percent by weight of a humectant;
   from about 0.3 to about 3 percent by weight of a surfactant; and
   an aqueous carrier fluid, wherein the dielectric layer has an average dielectric constant at 1 MHz of 3.44 to 4.12, wherein the aqueous composition further comprises one or more additives that include at least $BaTiO_3$, $SrTiO_3$, $Mg_2TiO_4$, $Bi_2(TiO_3)_3$, $PbTiO_3$, $NiTiO_3$, $CaTiO_3$, $ZnTiO_3$, $Zn_2TiO_4$, $BaSnO_3$, $Bi(SnO_3)_3$, $CaSnO_3$, $PbSnO_3$, $PbMgNbO_3$, $MgSnO_3$, $SrSnO_3$, $ZnSnO_3$, $BaZrO_3$, $CaZrO_3$, $PbZrO_3$, $MgZnO_3$, $SrZrO_3$, or $ZnZrO_3$.

2. The electronic device of claim 1, wherein the humectant comprises propylene glycol.

3. The electronic device of claim 1, wherein the humectant has a boiling point below about 200° C.

4. The electronic device of claim 1, wherein the surfactant comprises at least one non-ionic surfactant.

5. The electronic device of claim 1, wherein the dielectric layer has a thickness greater than 20 microns.

6. The electronic device of claim 1, wherein the aqueous composition has a surface tension ranging from about 25 dynes cm to about 55 dynes/cm.

7. The electronic device of claim 1, further comprising particles, wherein the particles are metal oxide particles dispersed in the aqueous composition, wherein the particles are configured to adjust dielectric constant and contribute to uniformity of solids deposition in the dielectric layer.

8. The electronic device of claim 1, wherein the aqueous composition further comprises one or more additives selected from the group consisting of: $TiO_2$ and cerium oxide.

9. The electronic device of claim 1, wherein the aqueous composition further comprises one or more additives, wherein the additives are aluminum metal oxide, zinc metal oxide, titanium metal oxide or zirconium metal oxide.

10. The electronic device of claim 1, wherein the polymeric binder has a glass transition temperature of 30° C. to 100° C.

11. The electronic device of claim 1, wherein the dielectric layer forms a transistor, diode, capacitor or resistor.

12. The electronic device of claim 1, wherein the aqueous composition has a viscosity ranging from about 2 to about 6 centipoise.

13. The electronic device of claim 1, further comprising:
   at least a first conductive silver trace and a second conductive silver trace disposed on the dielectric layer, the first and the second conductive silver traces being adjacent one another at a distance of about 400 microns; and
   an additional dielectric layer disposed over the first and the second conductive silver traces, wherein electrical insulation is maintained between the first and the second conductive silver traces after 40 days of continuous 20V electrical bias at 85° C. and 85% relative humidity.

14. The electronic device of claim 1, wherein the dielectric layer has a breakdown voltage above 500 V/mil.

15. The electronic device of claim 1, wherein the dielectric layer has a resistivity above 1.0 E+14 Ohm-cm.

16. The electronic device of claim 1, wherein the dielectric layer has a tensile strength of 3300 psi to yield.

17. The electronic device of claim 1, wherein the dielectric layer has a water uptake of 6.9 wt. % over 72 hours at 40° C.

18. The electronic device of claim 1, wherein the dielectric layer has a water uptake of 2.9 wt. % over 24 hours at ambient temperature.

* * * * *